United States Patent [19]

Baliga et al.

[11] Patent Number: 5,436,174
[45] Date of Patent: Jul. 25, 1995

[54] METHOD OF FORMING TRENCHES IN MONOCRYSTALLINE SILICON CARBIDE

[75] Inventors: Bantval J. Baliga; Dev Alok, both of Raleigh, N.C.

[73] Assignee: North Carolina State University, Raleigh, N.C.

[21] Appl. No.: 8,719

[22] Filed: Jan. 25, 1993

[51] Int. Cl.6 .................... H01L 21/76; H01L 21/266
[52] U.S. Cl. ........................ 437/22; 437/35; 437/24; 437/67; 437/38; 148/DIG. 148
[58] Field of Search ............ 437/22, 24, 35, 38, 437/64, 67; 148/DIG. 148; 156/628

[56] References Cited

U.S. PATENT DOCUMENTS

| | | | |
|---|---|---|---|
| 4,108,715 | 8/1978 | Ishikawa et al. | 156/628 |
| 4,735,920 | 4/1988 | Stephanie et al. | 148/DIG. 148 |
| 4,925,805 | 5/1990 | Var Ommen et al. | |
| 4,981,551 | 1/1991 | Palmour | |
| 5,087,576 | 2/1992 | Edmond et al. | 437/22 |
| 5,270,244 | 12/1993 | Baliga | 437/67 |

FOREIGN PATENT DOCUMENTS

| | | |
|---|---|---|
| 56-112723 | 9/1981 | Japan. |
| 59-112618 | 6/1984 | Japan. |
| 298129 | 4/1990 | Japan. |
| 3228315 | 10/1991 | Japan. |

OTHER PUBLICATIONS

Wolf, S. et al. Silicon Processing for the VLSI Era: vol. 1, Process Technology Lattice Press, pp. 292-293 & 321, 1986.

Trew, Yan and Mock, "The Potential of Diamond and SiC Electronic Devices for Microwave and Millimeter-Wave Power Applications," Proceedings of the IEEE, vol. 79, No. 5, pp. 598-620, May, 1991.

Bhatnagar and Baliga, "Analysis of Silicon Carbide Power Device Performance", IEEE, pp. 176-180, 1991.

Pan and Steckl, "Reaction Ion Etching of SiC Thin Films by Mixtures of Fluorinated Gases and Oxygen", J. Electrochem. Soc., vol. 137, No. 1, pp. 212-220, Jan., 1990.

Davis, "Epitaxial Growth and Doping of and Device Development in Monocrystalline $\beta$-SiC Semiconductor Thin Films," Thin Solid Films, vol. 181, pp. 1-15, Dec., 1989.

Shenai, Scott and Baliga, "Optimum Semiconductors for High-Power Electronics", IEEE Transactions on Electron Devices, vol. 36, No. 9, pp. 1811-1823, Sep., 1989.

Bumgarner, Kong, and Kim, et al., "Monocrystalline $\beta$-SiC Semiconductor Thin Films: Epitaxial Growth, Doping, and FET Device Development," 1988 Proceedings of the 38th Electronics Components Conf., pp. 342-349, 1988.

Daimon, Yamanaka, Shinohara, Sakuma, Misawa, Endo and Yoshida, "Operation of Schottky-Barrier Field Effect Transistors of 3C-SiC up to 400° C.", Appl. Phys. Lett., vol. 51, pp. 2106-2108, Dec., 1987.

Kelner, Binari, Sleger and Kong, "$\beta$-SiC MESFET's (List continued on next page.)

Primary Examiner—George Fourson
Attorney, Agent, or Firm—Bell, Seltzer, Park & Gibson

[57] ABSTRACT

A trench is formed in a monocrystalline silicon carbide substrate by amorphizing a portion of the monocrystalline silicon carbide substrate to define an amorphous silicon carbide region therein. The amorphous silicon carbide region is then removed, to produce a trench in the monocrystalline silicon carbide substrate corresponding to the removed amorphous silicon carbide region. The substrate may be amorphized by implanting ions into a masked substrate so that the implanted ions convert the unmasked portions of the substrate into amorphous silicon carbide. The amorphous silicon carbide may be etched using at least one etchant which etches amorphous silicon carbide relatively quickly and etches monocrystalline silicon carbide relatively slowly, such as hydrofluoric acid and nitric acid. The amorphizing and removing steps may be repeatedly performed to form deep trenches.

9 Claims, 2 Drawing Sheets

OTHER PUBLICATIONS and Buried Gate JFET's", IEEE Electron Device Letters, vol. EDL-8, No. 9, pp. 428–430, Sep. 1987.

Kong, Palmour, Glass and Davis, "Temperature Dependence of the Current–Voltage Characteristics of Metal–Semiconductor . . . Via Chemical Vapor Deposition", Appl. Phys. Lett., vol. 51, pp. 442–444, Aug., 1987.

Kelner, Binari, Sleger and Kong, "$\beta$-SiC MESFETs", Mater. Res. Soc. Symp. Proc., vol. 97, pp. 227–232, Sep., 1987.

Edmond, Palmour, and Davis, "Chemical Etching of Ion Implanted Amorphous Silicon Carbide," J. Electrochem. Soc.: Solid-State Science and Technology, pp. 650–652, Mar., 1986.

Sugiura, Lu, Cadien and Steckl, "Reactive Etching of SiC Thin Films Using Fluorinated Gases", J. Vac. Sci. Technology. B 4 (1), pp. 349–355, Jan.–Feb., 1986.

Chang, Fang, Huong, and Wu, "Noval Passivation Dielectrics—The Boron–or Phosphorus–Doped Hydrogenated Amorphous Silicon Carbide Films", J. Electro Chem. Soc.: Solid State Science and Technology, pp. 418–422, Feb., 1985.

McHargue, Lewis, Williams and Appleton, "The Reactivity of Ion–Implanted SiC", Materials Science and Engineering, vol. 69, pp. 391–395, 1985.

Palmour, Davis, Astell-Burt and Blackborow, "Effects of Cathode Materials and Gas Species on the Surface Characteristics of Dry Etched Monocrystalline Beta-SiC Thin Films", Silicon Carbide, pp. 491–550 (date unknown).

METHOD OF FORMING TRENCHES IN MONOCRYSTALLINE SILICON CARBIDE

CROSS REFERENCE TO RELATED APPLICATIONS

This application is related to application Ser. No. 08/008,747, entitled SILICON CARBIDE FIELD EFFECT TRANSISTOR AND METHOD OF FABRICATING SAME, now U.S. Pat. No. 5,322,802; application Ser. No. 08/008,203, entitled METHOD FOR FORMING A P-N JUNCTION IN SILICON CARBIDE, AND P-N JUNCTION FORMED THEREBY, now U.S. Pat. No. 5,318,915; and application Ser. No. 08/008,766, entitled METHOD FOR FORMING AN OXIDE-FILLED TRENCH IN SILICON CARBIDE, now U.S. Pat. No. 5,270,244; all filed concurrently herewith, the disclosures of which are hereby incorporated herein by reference.

FIELD OF THE INVENTION

This invention relates to microelectronic device manufacturing methods and more particularly to methods of manufacturing microelectronic devices in monocrystalline silicon carbide.

BACKGROUND OF THE INVENTION

As is well known to those having skill in the art, monocrystalline silicon carbide is particularly well suited for use in semiconductor devices, such as integrated circuit semiconductor devices and power semiconductor devices. Integrated circuit semiconductor devices typically include many active devices such as transistors in a single semiconductor substrate. Power semiconductor devices, which may be integrated circuit devices, are semiconductor devices which carry large currents and support high voltages.

Silicon carbide has a wide bandgap, a high melting point, a low dielectric constant, a high breakdown field strength, a high thermal conductivity and a high saturated electron drift velocity compared to silicon, which is the most commonly used semiconductor material. These characteristics allow silicon carbide microelectronic devices to operate at high temperatures and higher power levels than conventional silicon based devices. In addition to the above advantages, silicon carbide power devices can operate with lower specific on resistance than conventional silicon power devices. The advantages of silicon carbide for forming power devices is described in a publication by M. Bhatnagar and coinventor B. J. Baliga entitled *Analysis of Silicon Carbide Power Device Performance*, ISPSD '91, Abstr. 8.3, pp 176–180 (1991).

Many microelectronic devices require the formation of trenches at a face of a semiconductor substrate. For example, one of the most popular types of power metal oxide field effect transistor (MOSFET) devices is the ultra-low on-resistance MOS device (UMOS). The UMOS device, also referred to as a "trench DMOS" device, is described in publications entitled *An Ultra-Low On-Resistance Power MOSFET Fabricated by Using a Fully Self-Aligned Process*, by Ueda et al., IEEE Transactions on Electron Devices, Vol. ED34, No. Apr. 4, 1987, pp. 926–930; *Numerical and Experimental Comparison of 60V Vertical Double-Diffused MOSFETS and MOSFETS with a Trench-Gate Structure* by Chang, Solid State Electronics, Vol. 32, No. 3, pp. 247–251, 1989; and Trench *DMOS Transistor Technology for High-Current* (100A *Range) Switching* by Buluce et al., Solid State Electronics, Vol. 34, No. 5, pp. 493–507, 1991. In forming a UMOS, reactive ion etching is typically used to form rectangular grooves or trenches in the substrate.

Unfortunately, while it is relatively easy to form well defined trenches having vertical walls, (i.e. walls which are orthogonal to the substrate face) in silicon substrates, using reactive ion etching or other techniques, it has heretofore been difficult to etch monocrystalline silicon carbide due to the inert nature of silicon carbide. Accordingly, although reactive ion etching of silicon carbide has been described, using various fluorinated gases such as carbon tetrafluoride and oxygen, sulfur hexafluoride and oxygen, or nitrogen trifluoride and oxygen, the results have not been entirely satisfactory. In particular, the etch rates using these reactive ion etching processes have not been as fast as is desirable for high volume, microelectronic device production, and it is difficult to form trenches with vertical walls.

SUMMARY OF THE INVENTION

It is therefore an object of the present invention to provide an improved method of forming trenches in monocrystalline silicon carbide.

It is another object of the present invention to provide a method for forming trenches having vertical walls in monocrystalline silicon carbide.

These and other objects are provided, according to the present invention, by amorphizing a portion of a monocrystalline silicon carbide substrate to define an amorphous silicon carbide region in the monocrystalline silicon substrate, and removing the amorphous silicon carbide region from the monocrystalline silicon carbide substrate, to thereby produce a trench in the monocrystalline silicon carbide substrate corresponding to the removed amorphous region. In other words, according to the invention, rather than directly etching the monocrystalline silicon carbide, the portion to be etched is first converted to amorphous silicon carbide, which may then be etched relatively easily.

Preferably, the amorphizing step comprises implanting ions into a portion of the monocrystalline silicon carbide substrate, such that the implanted ions convert the portion of the monocrystalline silicon carbide substrate into amorphous silicon carbide. Ion implantation may take place through a mask which exposes an area on the silicon carbide substrate face corresponding to the portion. Ions are then directed to the face of the silicon carbide substrate such that the ions implant into the silicon carbide substrate through the exposed area. Since ion implantation may be performed in a highly directional manner, the amorphous region so formed has vertical walls. Consequently, the trench will also have vertical walls. The ion implantation may use silicon, carbon, argon, aluminum, helium, hydrogen, neon and other ions, and combinations thereof. Multiple implants may be performed to obtain a uniform amorphous region at the desired depth.

Although electrically active ions with respect to silicon carbide can be used, electrically inactive ions are preferred. In particular, a portion of the monocrystalline silicon carbide substrate is amorphized by preferably implanting electrically inactive ions into the portion of the substrate such that the implanted electrically inactive ions convert the portion into a region of amorphous silicon carbide. Such electrically inactive ions include those ions which do not provide N or P-type doping for silicon carbide, and may include silicon, carbon, argon, hydrogen, neon and helium.

After implantation, the amorphous silicon carbide region is preferably removed from the monocrystalline silicon carbide substrate by etching the silicon carbide substrate with at least one etchant which etches amorphous silicon carbide relatively quickly and etches monocrystalline silicon carbide relatively slowly. Since amorphous silicon carbide is more chemically reactive than monocrystalline silicon carbide, etching may take place at high etch rates. Preferred etchants are hydrofluoric acid, buffered hydrofluoric acid or hydrofluoric and nitric acid, combinations thereof and other well known etchants which etch amorphous silicon carbide relatively quickly and etch monocrystalline silicon carbide relatively slowly.

If deeper trenches are desired than can be easily formed with a single amorphizing step, the amorphizing and removing steps can be repeatedly performed, using the same mask, to produce a narrow and deep trench (for example, less than one micron wide and several microns deep) in the silicon carbide substrate. The trench surfaces will also typically be smoother than that obtained by reactive ion etching, thereby providing microelectronic devices with superior device characteristics.

It will be understood by those having skill in the art that, in order to form a trench, a portion of the monocrystalline silicon carbide may be converted to non-monocrystalline silicon carbide such as polycrystalline silicon carbide, and etched with an etchant which etches polycrystalline silicon carbide relatively quickly and etches monocrystalline silicon carbide relatively slowly. It will also be understood by those having skill in the art that the amorphizing step of the present invention may be used as a first step for forming microelectronic features other than trenches in a monocrystalline silicon carbide substrate. In other words, the amorphous silicon carbide region may be used to form microelectronic features other than trenches for use in producing a microelectronic device in the monocrystalline silicon carbide substrate. For example, a semiconductor junction may be formed as described in copending application Ser. No. 08/008,203, now U.S. Pat. No. 5,318,915, or a silicon dioxide region may be formed as described in copending application Ser. No. 08/008,766, now U.S. Pat. No. 5,270,244.

DETAILED DESCRIPTION OF PREFERRED EMBODIMENTS

Figure 1A:
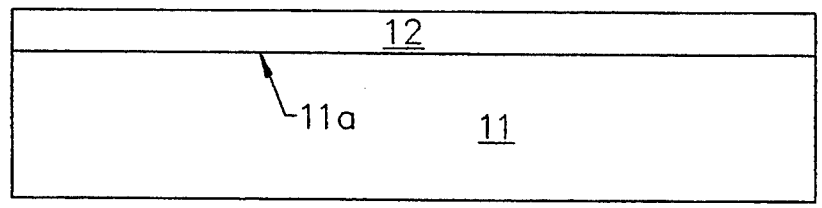
FIGS. 1A-1G are cross-sectional side views of a monocrystalline silicon carbide substrate during intermediate processing steps for forming trenches therein according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIGS. 1A-1G, a method for forming trenches in a monocrystalline silicon carbide substrate according to the invention will now be described. As shown in FIG. 1A, a monocrystalline silicon carbide substrate 11 is provided. For example, a 6H monocrystalline silicon carbide substrate may be used. A mask 12, such as a 2 $\mu$m thick photoresist layer, is formed on face 11a of substrate 11 using standard techniques. Alternatively, in order to provide a mask which is better able to mask the subsequent ion implantation, and is highly resistant to attack by etchants, a layer of platinum, about 2000 Å thick, may be used as mask 12.

Figure 1B:
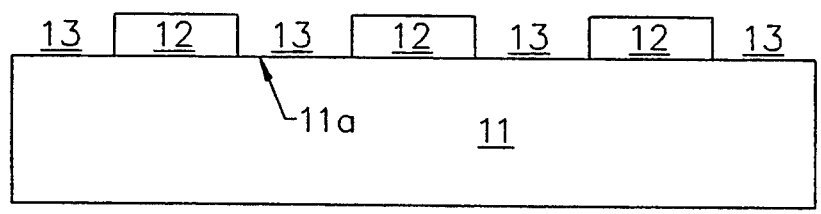

As shown in FIG. 1B, mask 12 is patterned to expose areas 13 on face 11a, using standard patterning techniques which need not be described herein further.

Figure 1C:
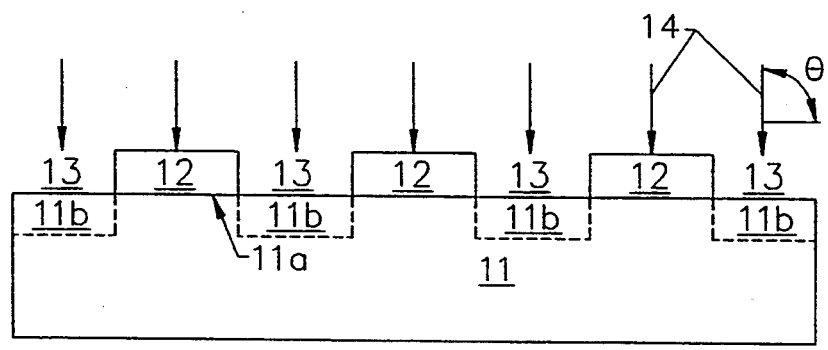

Referring now to FIG. 1C, ions 14 are directed to the face 11a of silicon carbide substrate 11, such that the ions implant into the silicon carbide substrate through the exposed areas 13. The ion 14 which is used, and the dosage and energy of the implant are chosen so that the implanted ions 14 create amorphous regions 11b in the first face 11a of silicon carbide substrate 11, from the first face 11a, to a desired depth.

There are a number of ions which can amorphize silicon carbide. The TABLE below illustrates ions which can be used, and the dose to produce a desired depth of amorphous region 11b at 200 keV energy. It will also be understood by those having skill in the art that lighter ions such as hydrogen typically penetrate the substrate to a greater depth than heavier ions such as argon, for a given implant dose. Multiple implants at different energies may be used to amorphize region 11b, in order to obtain a uniform amorphous region at the desired depth.

Although electrically active ions with respect to silicon carbide can be used, electrically inactive ions are preferred. In particular, a portion of the monocrystalline silicon carbide substrate is amorphized by preferably implanting electrically inactive ions into the portion of the substrate such that the implanted electrically inactive ions convert the portion into an amorphous silicon carbide region 11b. Such electrically inactive ions include those ions which do not provide N or P-type doping for silicon carbide, and may include silicon, carbon, argon, hydrogen, neon and helium.

| Implanted Ion | Depth of Amorphous Region (Å) | Dose (cm$^{-2}$) |
| --- | --- | --- |
| Ar++ | 5000 | 6E14 |
| Ar+ | 2100 | 4.8E14 |
| Al+ | 3000 | 1E15 |
| C+ | 6000 | 7E15 |
| He+ | 9000 | 1E17 |
| Si+ | 2800 | 8E14 |
| H+ | 15,000 | 2E18 |
| Ne+ | 4000 | 2E15 |

It will be understood by those having skill in the art that ion implantation can be performed in a highly directional manner. Accordingly, as shown in FIG. 1C, the ions 14 may be implanted in a substantially vertical direction (i.e. orthogonal to face 11a such that angle $\theta$ is 90°), to thereby form amorphized regions 11b with vertical walls. However, it will also be understood by those having skill in the art that if other trench profiles are desired, implantations including a horizontal component, or directional implantations at oblique angles $\theta$, may be performed.

Figure 1D:
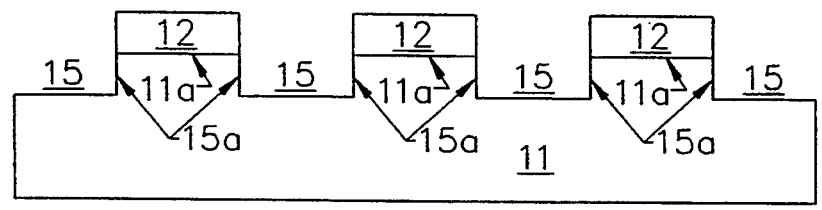

Referring now to FIG. 1D, the amorphous silicon carbide regions 11b are removed from monocrystalline silicon carbide substrate 11, for example by etching the silicon carbide substrate 11 with at least one etchant which etches amorphous silicon carbide relatively quickly and etches monocrystalline silicon carbide relatively slowly. Example etchants which can be used are hydrofluoric acid (HF), buffered HF, and HF+HNO$_3$ (nitric acid). These etchants do not attack monocrystalline silicon carbide at an appreciable rate at room temperature, but do attack amorphous silicon carbide readily. Accordingly, trenches 15 are formed in the monocrystalline silicon substrate 11 corresponding to the removed amorphous regions 11b. Since the ion implantation of FIG. 1C was orthogonal to the face 11a, the trenches 15 have vertical trench walls 15a.

Figure 1E:
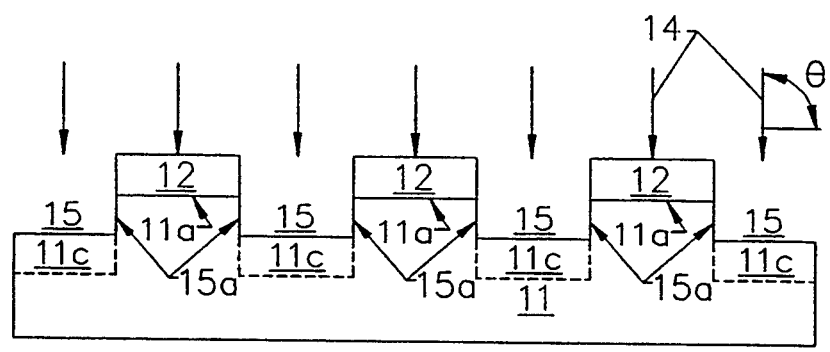
Figure 1F:
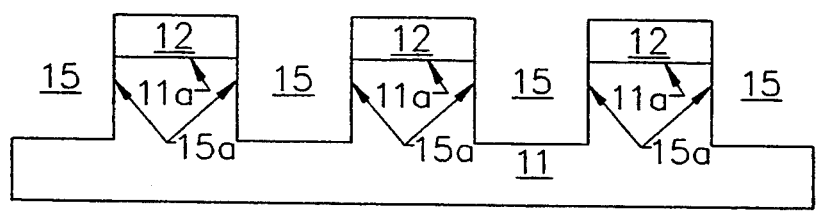
Figure 1G:
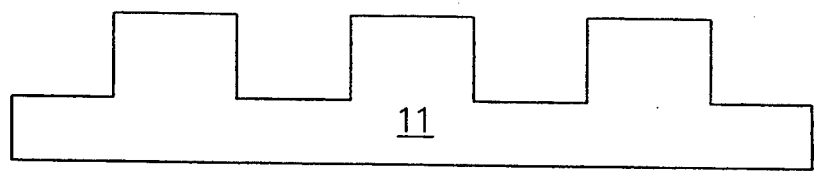

After the trenches are formed, the mask may be removed, and additional processing may be performed on silicon carbide substrate 11. If it is desired to fabricate deeper trenches than can be performed with a single amorphization, the process of FIGS. 1C and 1D may be repeated. Thus, as shown in FIG. 1E, a second implant or set of implants of ions 14 is performed to form second amorphous regions 11c in silicon carbide substrate 11 at the bottom of trenches 15. As shown in FIG. 1F, a second etch is performed to form deeper trenches than illustrated in FIG. 1D. Mask 12 may then be removed, or additional implant and etch steps may be performed. It will be understood by those having skill in the art that the implant parameters may be varied from one implant step to another to form desired trench profiles, or for other purposes.

The following Example is included as illustrative of the present invention and without being limiting thereof.

EXAMPLE

A 2 μm thick photoresist mask 12 was formed on a face 11a of a 6H monocrystalline silicon carbide substrate 11 to form the structure of FIG. 1A. The mask was patterned using standard photolithographic techniques to create the structure of FIG. 1B. Multiple implants of argon were performed at implant energies of 50, 130, 200, 300, and 400 keV, all at a dose of $10^{15}/cm^2$, to produce 0.5 μm deep amorphous regions 11b as illustrated in FIG. 1C.

The thickness of the amorphous regions 11b created by the ion implantation was verified using Rutherford Back Spectroscopy (RBS). RBS measurements indicated that the thickness of the amorphous region 11b was 0.4 μm. The mask 12 was then removed and the substrate was etched in an HF+HNO$_3$ (1:1 by volume) solution at 65° C. for ten minutes. The etching time was deliberately kept long to ensure complete etching of the amorphous layer.

The etch depth was measured using a profilometer and was found to be 0.37 μm. This is very close to the depth of the amorphized regions 11c, and proves that the technique can be used to etch monocrystalline silicon carbide with precise control of depth. The walls and floors of the trenches 15 were observed using a scanning electron microscope (SEM) and found to be extremely smooth. The maximum irregularity on the etched surfaces was less than 100 Å.

The chemical composition of the etched surface was determined using Auger Electron Spectroscopy. Auger Electron Spectroscopy indicated that there is an increase in the carbon concentration on the surface. This is because the etch rate of carbon is lower than the etch rate of silicon in HF+HNO$_3$ solution at 65° C. However, the carbon can be removed by increasing its etch rate in the HF+HNO$_3$ solution by raising the temperature.

Accordingly, it has been shown that trenches may be formed in monocrystalline silicon carbide by amorphizing a portion of the monocrystalline silicon carbide substrate to define an amorphous silicon carbide region therein, and removing the amorphous silicon carbide region to thereby produce a trench. Vertical trench profiles may be produced rapidly and reliably. Silicon carbide microelectronic devices with trenches may be formed thereby.

The present invention can also be used to form a trench in monocrystalline silicon carbide by converting a portion of the monocrystalline silicon carbide substrate to nonmonocrystalline silicon carbide, such as polycrystalline silicon carbide, to thereby define a nonmonocrystalline silicon carbide region in a monocrystalline silicon carbide substrate. The nonmonocrystalline silicon carbide region can then be removed from the monocrystalline silicon carbide substrate, for example by etching in HF+HNO$_3$, to thereby produce a trench in the monocrystalline silicon carbide substrate corresponding to the removed nonmonocrystalline region.

The present invention can also be used to form microelectronic features other than trenches in a monocrystalline silicon carbide substrate. For example, a p-n junction may be formed in silicon carbide by first amorphizing, doping and recrystallizing a region in the silicon carbide substrate as described in application Ser. No. 08/008,203, now U.S. Pat. No. 5,318,915, entitled METHOD FOR FORMING A P-N JUNCTION IN SILICON CARBIDE, AND P-N JUNCTION FORMED THEREBY filed concurrently herewith. Alternatively, a deep oxide region can be formed by amorphizing and then oxidizing the silicon carbide substrate as described in application Ser. No. 08/008,766, now U.S. Pat. No. 5,270,244, entitled METHOD FOR FORMING AN OXIDE-FILLED TRENCH IN SILICON CARBIDE, filed concurrently herewith. Other microelectronic features may also be formed. Accordingly, portions of the monocrystalline silicon carbide substrate may be amorphized and then microelectronic features may be formed using the amorphous silicon carbide region, to produce microelectronic devices in the monocrystalline silicon carbide substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a trench in a monocrystalline silicon carbide substrate, comprising the steps of:

directing first electrically inactive ions selected from the group consisting of silicon, hydrogen, neon, helium, carbon and argon to a face of a monocrystalline silicon carbide substrate, so that the first electrically inactive ions implant into a first portion of the monocrystalline silicon carbide substrate and create a first amorphous silicon carbide region therein, said first electrically inactive ions directing step also being performed so that the first electrically inactive ions are implanted at a first oblique angle relative to an axis extending orthogonal to the face; and removing the first amorphous silicon carbide region from the monocrystalline silicon carbide substrate to thereby form a trench in the monocrystalline silicon carbide substrate, said trench having a first sidewall and a bottom which intersects the first sidewall at a second oblique angle which is different from 90 degrees by an amount equal to the first oblique angle.

2. The method of claim 1, wherein said removing step comprises the step of etching the silicon carbide substrate with at least one etchant which selectively etches amorphous silicon carbide at a higher rate than monocrystalline silicon carbide.

3. The method of claim 1, wherein said first electrically inactive ions directing step and said removing step are performed in sequence to form a trench having a first depth and then said first electrically inactive ions directing step and said removing step are again performed in sequence so that the trench has a second depth, greater than the first depth.

4. The method of claim 1, wherein said first electrically inactive ions directing step is repeatedly performed before said removing step is performed.

5. The method of claim 1, wherein said first electrically inactive ions directing step comprises the step of directing first electrically inactive ions from the group to the face and then directing second electrically inactive ions from the group, different from the first electrically inactive ions, to the face.

6. The method of claim 2, wherein the at least one etchant is selected from the group consisting of HF, buffered HF and HF+HNO$_3$.

7. The method of claim 1, wherein said removing step is preceded by the step of directing electrically inactive ions selected from the group consisting of silicon, hydrogen, neon, helium, carbon and argon to the face of the monocrystalline silicon carbide substrate, so that the electrically inactive ions implant into a second portion of the monocrystalline silicon carbide substrate and create a second amorphous silicon carbide region therein, said electrically inactive ions directing step also being performed so that the electrically inactive ions are implanted at a third oblique angle relative to an axis extending orthogonal to the face.

8. A method of forming a trench in a monocrystalline silicon carbide substrate, comprising the steps of:

directing first electrically inactive ions selected from the group consisting of silicon, hydrogen, neon, helium, carbon and argon to a face of a monocrystalline silicon carbide substrate, so that the first electrically inactive ions implant into a first portion of the monocrystalline silicon carbide substrate and create a first amorphous silicon carbide region therein, said first electrically inactive ions directing step also being performed so that the first electrically inactive ions are implanted at a first oblique angle relative to an axis extending orthogonal to the face; and directing second electrically inactive ions selected from the group consisting of silicon, hydrogen, neon, helium, carbon and argon to the face of the monocrystalline silicon carbide substrate, so that the second electrically inactive ions implant into a second portion of the monocrystalline silicon carbide substrate and create a second amorphous silicon carbide region therein, said directing second electrically inactive ions step also being performed so that the second electrically inactive ions are implanted at a third oblique angle relative to an axis extending orthogonal to the face; and removing the first and second amorphous silicon carbide regions from the monocrystalline silicon carbide substrate to thereby form a trench in the monocrystalline silicon carbide substrate, said trench having a first sidewall and a bottom which intersects the first sidewall at a second oblique angle which is different from 90° by an amount equal to the first oblique angle, said trench also having a second sidewall which intersects the bottom at a fourth oblique angle which is different from 90° by an amount equal to the third oblique angle.

9. The method of claim 8, wherein the second oblique angle equals the fourth oblique angle.

* * * * *